United States Patent
Urano et al.

(10) Patent No.: US 6,399,279 B1
(45) Date of Patent: Jun. 4, 2002

(54) METHOD FOR FORMING A POSITIVE IMAGE

(75) Inventors: Toshiyuki Urano; Etsuko Hino; Mitsuru Sasaki, all of Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/232,727

(22) Filed: Jan. 19, 1999

(30) Foreign Application Priority Data

Jan. 16, 1998 (JP) .......................................... 10-006229
Mar. 16, 1998 (JP) .......................................... 10-064992
Aug. 11, 1998 (JP) .......................................... 10-226800

(51) Int. Cl.$^7$ ................................................ G03F 7/32
(52) U.S. Cl. .................... 430/302; 430/270.1; 430/434
(58) Field of Search .......................... 430/270.1, 302, 430/434

(56) References Cited

U.S. PATENT DOCUMENTS

| | | | |
|---|---|---|---|
| 3,628,953 A | | 12/1971 | Brinckman .................. 96/36.3 |
| 3,645,733 A | | 2/1972 | Brinckman et al. ............. 96/36 |
| 3,891,439 A | * | 6/1975 | Katz et al. ...................... 96/49 |
| 4,259,434 A | * | 3/1981 | Yamasue ...................... 430/302 |
| 4,708,925 A | | 11/1987 | Newman ...................... 430/270 |
| 5,332,648 A | * | 7/1994 | Kihara ........................ 430/270 |
| 5,340,699 A | | 8/1994 | Haley et al. ................. 430/302 |
| 5,372,907 A | | 12/1994 | Haley et al. ................. 430/157 |
| 5,480,762 A | * | 1/1996 | Toyama et al. ............. 430/302 |
| 5,491,046 A | | 2/1996 | DeBoer et al. ............. 430/302 |
| 5,532,116 A | * | 7/1996 | Suzuki et al. ................. 430/331 |
| 5,536,619 A | * | 7/1996 | Verburgh ................... 430/273.1 |
| 5,658,708 A | * | 8/1997 | Kondo ..................... 430/286.1 |
| 5,663,037 A | | 9/1997 | Haley et al. ............. 430/178.1 |
| 5,811,221 A | * | 9/1998 | Miller et al. .................. 430/302 |
| 5,814,431 A | * | 9/1998 | Nagasaka et al. ......... 430/281.1 |
| 5,840,467 A | | 11/1998 | Kitatani et al. .............. 430/302 |
| 5,858,604 A | * | 1/1999 | Takeda et al. ............... 430/162 |
| 6,060,217 A | | 5/2000 | Nguyen et al. .............. 430/302 |
| 6,074,802 A | * | 6/2000 | Murata et al. ........... 430/270.1 |
| 6,083,663 A | * | 7/2000 | Vermeersch et al. ........ 430/302 |
| 6,090,532 A | * | 7/2000 | West et al. .................. 430/326 |
| 6,110,646 A | * | 8/2000 | Urano et al. ................. 430/302 |

FOREIGN PATENT DOCUMENTS

| | | |
|---|---|---|
| EP | 0 631 189 | 12/1994 |
| EP | 0 652 483 | 5/1995 |
| EP | 0 784 233 | 7/1997 |
| EP | 0 833 204 | 4/1998 |
| EP | 0 864 420 | 9/1998 |
| GB | 2082339 | 3/1982 |
| JP | 43847 | 2/1997 |
| WO | WO 97/07986 | 3/1997 |
| WO | WO 97/39894 | 10/1997 |

\* cited by examiner

*Primary Examiner*—Janet Baxter
*Assistant Examiner*—Barbara Gilmore
(74) *Attorney, Agent, or Firm*—Oblon, Spivak, McClelland, Maier & Neustadt, P.C.

(57) ABSTRACT

A method for forming a positive image, which comprises exposing an image-forming material comprising a substrate and a positive photosensitive composition layer containing a novolak resin and a photo-thermal conversion material which absorbs light from an image exposure light source and converts it to heat and not containing a thermally decomposable material which decomposes by the action of heat generated by the photo-thermal conversion material upon absorption of light from the image exposure light source, formed on the substrate, followed by development with an alkali developer containing an amphoteric surfactant to form a positive image.

27 Claims, No Drawings

METHOD FOR FORMING A POSITIVE IMAGE

BACKGROUND OF THE INVENTION

1. Field of the Invention

The present invention relates to a method for forming an image by means of a positive photosensitive material made of a photosensitive composition containing a photo-thermal conversion material sensitive mainly to light in a near infrared region, which is useful e.g. for a copper etching resist for a lithographic printing plate, a proof for offpress proof printing, a printed wiring board or gravure, for a color filter resist useful for the production of a flat display, or for a photoresist useful for the production of LSI. Particularly, it relates to a method for forming an image by means of a positive photosensitive material, which is useful for direct plate making by e.g. a semiconductor laser or a YAG laser.

2. Discussion of Background

Heretofore, a printing plate having a photosensitive layer containing an alkali-soluble resin and a quinonediazide compound on a substrate, has been known as a positive photosensitive lithographic printing plate capable of forming a positive image by irradiation of ultraviolet light through a silver salt masking film original, followed by development by means of an aqueous alkali solution.

With the photosensitive layer containing the quinonediazide compound, the solubility of the alkali-soluble resin in the alkali developer is suppressed by the presence of the quinonediazide compound. On the other hand, by the irradiation of ultraviolet light, the quinonediazide compound will be photochemically decomposed to form indenecarboxylic acid, whereby the above solubility-suppressing effect will be lost, and the solubility of the above photosensitive layer in the alkali developer will rather be improved. Namely, the positive image-forming mechanisms of the photosensitive layer containing the quinonediazide compound is attributable to the difference in solubility as between the exposed portion and the non-exposed portion due to the chemical change as described above.

However, the conventional positive photosensitive lithographic printing plate having a photosensitive layer containing a quinonediazide compound has had a drawback that it must be handled under yellow light, as it has sensitivity to ultraviolet light.

Further, it is known that an aqueous alkaline solution containing alkali metal ions of e.g. sodium silicate, sodium carbonate or sodium hydroxide, is used as a developer for the positive photosensitive lithographic printing plate, that a surfactant can be used as one of various additives for the developer, and that use of an amphoteric surfactant is effective to improve the development latitude. However, in the case of a positive photosensitive lithographic printing plate of this type, the solubility of the exposed portion is accelerated by the presence of the amphoteric surfactant in the developer, while the solubility of the non-exposed portion is lowered by the action of the quinonediazide compound as described above, whereby the above-mentioned effect can be accomplished. Accordingly, the action of the surfactant is nothing more than the disclosure about the photosensitive layer which involves a chemical change for the formation of an image.

On the other hand, along with the progress in the image treating technology by computers, an attention has been drawn to a photosensitive or heat sensitive direct plate making system wherein a resist image is formed directly from digital image information by a laser beam or a thermal head without using a silver salt masking film. Especially, it has been strongly desired to realize a high resolution laser photosensitive direct plate making system employing a high power semiconductor laser or YAG laser, from the viewpoint of downsizing, the environmental light during the plate making operation and plate making costs.

As image-forming methods wherein laser photosensitivity or heat sensitivity is utilized, there have heretofore been known a method of forming a color image by means of a sublimable transfer dye and a method of preparing a lithographic printing plate. Known as the latter is, for example, a method of preparing a lithographic printing plate by means of the curing reaction of a diazo compound (e.g. JP-A-50-15603, JP-A-52-151024, JP-B-60-12939, JP-B-61-21831, JP-B-2-51732, JP-B-3-34051 and U.S. Pat. No. 3,664,737), or a method of preparing a lithographic printing plate by means of the decomposition reaction of nitrocellulose (e.g. JP-A-50-102401 and JP-A-50-102403).

In recent years, a technique in which a chemical amplification type photoresist is combined with a long wavelength light ray absorbing dye, has been proposed. For example, JP-A-6-43633 discloses a negative photosensitive material wherein a certain specific squarilium dye is combined with a photo-acid-generator and a binder. Further, as a technique of this type, JP-A-7-20629 discloses a method for preparing a positive or negative lithographic printing plate by exposing a photosensitive layer containing an infrared ray absorbing dye, latent Brønsted acid, a resol resin and a novolak resin, in an image pattern by e.g. a semiconductor laser, and JP-A-7-271029 discloses a similar method wherein a s-triazine compound is used instead of the above latent Brønsted acid. However, according to a study by the present inventors, these conventional techniques had a drawback that with negative photosensitive compositions which require heat treatment after exposure, the stability in the quality of the image thereby obtainable was not necessarily adequate dependent on the heat treatment conditions.

On the other hand, as a positive photosensitive material, JP-A-7-285275 discloses a positive photosensitive printing plate provided with a photosensitive layer containing a binder, a material which absorbs light and generates heat, and a material which is thermally decomposable and substantially lowers the solubility of the binder in a non-decomposed state (hereinafter referred to as a thermally decomposable material). It is disclosed that the printing plate is developed with an alkali developer to form an image, and to the developer, a surfactant such as an anionic, nonionic or amphoteric surfactant, an organic solvent, a reducing agent, an organic carboxylic acid, a defoaming agent and a hard water-softening agent, may be added as the case requires. However, the thermally decomposable compound containing in the photosensitive layer of the printing plate disclosed in the publication is an onium salt, a diazonium salt or a quinonediazide compound, which is well known as a compound having sensitivity to light in an ultraviolet region and thus has a drawback that it is inferior in the handling property under white light (hereinafter referred to as the safelight safety characteristics). The printing plate of this publication is one whereby an image is formed by a chemical change (a chemical change due to thermal decomposition) at the exposed portion.

Further, JP-A-10-3165 discloses an invention relating to a photosensitive composition comprising a certain acrylic resin or a polyurethane, polyester or polyamide resin having hydrophilic groups, a compound which lowers the solubility of said resin in an alkali solution, and an infrared-absorbing dye, and as additive components which may be added to the alkali developer as the case requires, an organic solvent, a water-soluble sulfite, a solubilizing agent, an anionic surfactant, an amphoteric surfactant, etc., are disclosed. However, nothing is disclosed about an additive for the developer in a case where the resin is a novolak resin. Further, the photosensitive composition disclosed in this publication contains specifically a diphenyl iodonium salt in the photosensitive composition and is considered to be one whereby an image is formed by a chemical change of a thermally decomposable material like the invention disclosed in the above-mentioned JP-A-7-285275.

Further, JP-A-9-43847 discloses a positive resist material wherein the crystallizability of the photosensitive material is changed by heating by irradiation with infrared rays, and a method for forming a pattern utilizing such a posiresist material, and WO97/39894 discloses a thermosensitive positive composition which contains an aqueous developable polymer and a compound to suppress the aqueous developability of the polymer, whereby the aqueous developability will be improved by heating, while the aqueous developability will not be improved by UV irradiation. The positive photosensitive materials disclosed in these publications do not contain a compound having a sensitivity to ultraviolet light and thus have a merit having safelight safety characteristics. Further, such positive photosensitive materials do not contain a material which undergoes a chemical change substantially by exposure like the above-described positive photosensitive lithographic printing plate and thus belong to a category technically different from the above-described positive photosensitive lithographic printing plate.

However, these positive photosensitive compositions have had a practical drawback such that the contrast between an image area and a non-image area is inadequate, and consequently, the non-image area may not sufficiently be removed, or the film-remaining ratio of the image area may not adequately be maintained, or, for such reasons, the allowance for the developing conditions tends to be narrow. For example, WO97/39894 relating to the positive composition, indicates that a positive image is formed by developing a positive printing plate with a developer containing a surfactant, a chelating agent, an organic solvent, an alkali component, etc., but specifically discloses nothing more than forming an image by using e.g. an aqueous sodium metasilicate pentahydrate solution as the developer. As a result of a study by the present inventors, it has been found that when the photosensitive materials as disclosed in JP-A-9-43847 and WO97/39894 are developed by an alkali developer, the film-remaining ratio of the image area (the non-exposed portion) is inadequate, and there is a further drawback that the scratch resistance is poor.

Especially when a photosensitive material is used as a printing plate, if the film-remaining ratio is poor, there will be a problem that the printing resistance and the inking property tend to be poor, and if the scratch resistance is poor, there will be a problem that reproducibility of the printed image tends to be poor, thus leading to practical problems as a printing plate.

SUMMARY OF THE INVENTION

The present invention has been made in view of the above-described prior art. On the basis of a photosensitive material having a photosensitive layer which does not contain a thermally decomposable compound which decomposes by the heat generated by a photo-thermal conversion material upon absorption of light from an image exposure light source (hereinafter referred to simply as a thermally decomposable material), specifically an onium salt, a diazonium salt or a quinonediazide compound, it is an object of the present invention to provide a method for forming a positive image, whereby the contrast between the image area (the non-exposed portion) and the non-image area (the exposed portion) is excellent, the film-remaining ratio of the image area can be sufficiently maintained, and the scratch resistance is also excellent.

The present inventors have conducted an extensive study to solve the above-mentioned problems on the basis of a positive image forming material comprising a substrate and a positive photosensitive composition layer containing a novolak resin and a photo-thermal conversion material which absorbs light from an image exposure light source and converts it to heat and not containing a thermally decomposable material, and as a result have found it possible to accomplish the above object by carrying out development by means of an alkali developer containing an amphoteric surfactant. The present invention has been accomplished on the basis of this discovery.

Namely, the present invention provides a method for forming a positive image, which comprises exposing an image-forming material comprising a substrate and a positive photosensitive composition layer containing a novolak resin and a photo-thermal conversion material which absorbs light from an image exposure light source and converts it to heat and not containing a thermally decomposable material which decomposes by the action of heat generated by the photo-thermal conversion material upon absorption of light from the image exposure light source, formed on the substrate, followed by development with an alkali developer containing an amphoteric surfactant to form a positive image.

In another aspect, the present invention provides a method for forming a positive image, which comprises exposing an image-forming material comprising a substrate and a positive photosensitive composition layer containing a novolak resin and a photo-thermal conversion material which absorbs light from an image exposure light source and converts it to heat and not containing an onium compound, a diazonium salt and a quinonediazide compound, formed on the substrate, followed by development with an alkali developer containing an amphoteric surfactant to form a positive image.

In a further aspect, the present invention provides a method for forming a positive image, which comprises exposing an image-forming material comprising a substrate and a positive photosensitive composition layer containing a novolak resin and a photo-thermal conversion material which absorbs light from an image exposure light source and converts it to heat and having substantially no sensitivity to ultraviolet light, formed on the substrate, followed by development with an alkali developer containing an amphoteric surfactant to form a positive image.

DETAILED DESCRIPTION OF THE PREFERRED EMBODIMENTS

In the present invention, the positive photosensitive composition constituting the positive photosensitive composition layer contains, as an essential component, a photo-thermal conversion material which absorbs light mainly in a near infrared region from an image exposure light source and converts it to heat.

Here, this photo-thermal conversion material is not particularly limited so long as it is a compound capable of converting absorbed light to heat. However, it is particularly preferably a light-absorbing dye having an absorption band covering a part or whole of a wavelength region of from 650 to 1,300 nm, preferably from 700 to 1,300 nm. As such a light-absorbing dye, a so-called cyanine dye in a broad sense which has a structure having e.g. a nitrogen atom, an oxygen atom or a sulfur atom bonded by a polymethine (—CH=)$_n$ and which is capable of taking a resonance structure, may be mentioned as a typical example. Specifically, it may, for example, be a quinoline type (a so-called cyanine type), an indole type (a so-called indocyanine type), a benzothiazole type (a so-called thiocyanine type), an iminocyclohexadiene type (a so-called polymethine type), a pyrylium type, a thiapyrylium type, a squarilium type, a chloconium type or an azulenium type. Among them, a quinoline type, an indole type, a benzothiazole type, an iminocyclohexadiene type, a pyrylium type or a thiapyrylium type is preferred.

In the present invention, among the above cyanine dyes, a quinoline dye of the following formula (Ia), (Ib) or (Ic) is preferred.

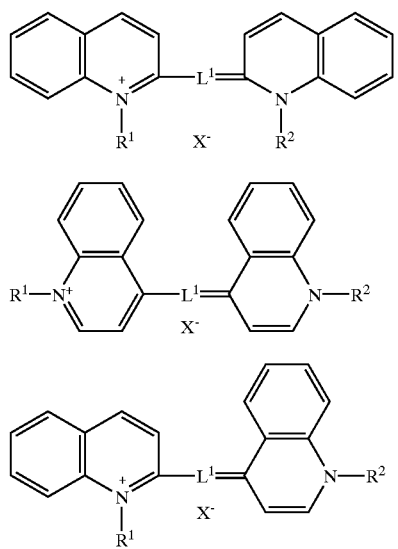

In the formulae (Ia), (Ib) and (Ic), each of $R^1$ and $R^2$ which are independent of each other, is an alkyl group which may have a substituent, an alkenyl group which may have a substituent, an alkynyl group which may have a substituent, or a phenyl group which may have a substituent, $L^1$ is a tri-, penta- or hepta-methine group which may have a substituent, wherein two substituents on the penta- or hepta-methine group may be linked to each other to form a $C_{5-7}$ cycloalkene ring, the quinoline ring may have substituents, wherein adjacent two substituents may be linked to each other to form a condensed benzene ring, and $X^-$ is a counter anion.

Here, the substituent in $R^1$ and $R^2$ in the formulae (Ia), (Ib) and (Ic) may, for example, be an alkoxy group, a phenoxy group, a hydroxy group or a phenyl group, and the substituent in $L^1$ may, for example, be an alkyl group, an amino group or a halogen atom. Likewise, the substituent in the quinoline ring may, for example, be an alkyl group, an alkoxy group, a nitro group or a halogen atom.

As the indole type and benzothiazole type dyes, those represented by the following formula (II) are preferred.

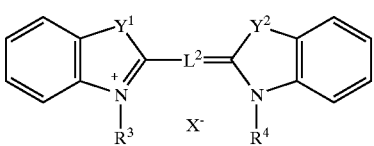

In the formula (II), each of $Y^1$ and $Y^2$ which are independent of each other, is a dialkylmethylene group or a sulfur atom, each of $R^3$ and $R^4$ which are independent of each other, is an alkyl group which may have a substituent, an alkenyl group which may have a substituent, an alkynyl group which may have a substituent, or a phenyl group which may have a substituent, $L^2$ is a tri-, penta- or hepta-methine group which may have a substituent, wherein two substituents on the penta- or hepta-methine group may be linked to each other to form a $C_{5-7}$ cycloalkene ring, the condensed benzene ring may have substituents, wherein adjacent two substituents may be linked to each other to form a condensed benzene ring, and $X^-$ is a counter anion.

Here, the substituent in $R^3$ and $R^4$ in the formula (II) may, for example, be an alkoxy group, a phenoxy group, a hydroxyl group or a phenyl group, the substituent in $L^2$ may, for example, be an alkyl group, an amino group or a halogen atom, and the substituent in the benzene ring may, for example, be an alkyl group, an alkoxy group, a nitro group or a halogen atom.

As the iminocyclohexadiene dyes, those represented by the following formula (III) are particularly preferred.

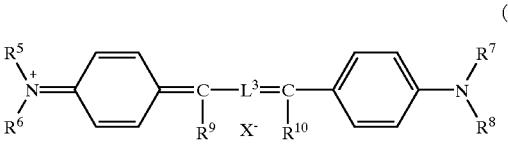

In the formula (III), each of $R^5$, $R^6$, $R^7$ and $R^8$ which are independent of one another, is an alkyl group, each of $R^9$ and $R^{10}$ which are independent of each other, is an aryl group which may have a substituent, a furyl group or a thienyl group, $L^3$ is a mono-, tri- or penta-methine group which may have a substituent, wherein two substituents on the tri- or penta-methine group may be linked to each other to form a $C_{5-7}$ cycloalkene ring, and $X^-$ is a counter anion.

Here, each of $R^9$ and $R^{10}$ in the formula (III) may specifically be, for example, a phenyl group, a 1-naphthyl group, a 2-naphthyl group, a 2-furyl group, a 3-furyl group, a 2-thienyl group or a 3-thienyl group, and the substituent thereon may, for example, be an alkyl group, an alkoxy group, a dialkylamino group, a hydroxyl group or a halogen atom, and the substituent in $L^3$ may, for example, be an alkyl group, an amino group or a halogen atom.

As the pyrylium type and thiapyrylium dyes, those represented by the following formula (IVa), (IVb) or (IVc) are particularly preferred.

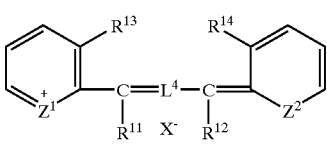

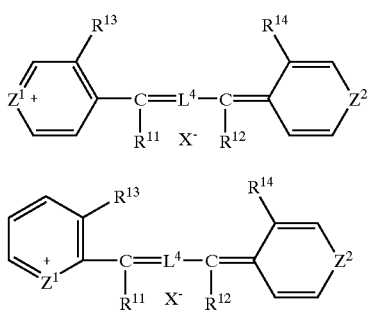

(IVb)

(IVc)

In the formulae (IVa), (IVb) and (IVc), each of $Z^1$ and $Z^2$ which are independent of each other, is an oxygen atom or a sulfur atom, each of $R^{11}$, $R^{12}$, $R^{13}$ and $R^{14}$ which are independent of one another, is a hydrogen atom or an alkyl group, or $R^{11}$ and $R^{13}$, or $R^{12}$ and $R^{14}$, may be linked to each other to form a $C_5$ or $C_6$ cycloalkene ring, $L_4$ is a mono-, tri- or penta-methine group which may have a substituent, wherein two substituents on the tri- or penta-methine group may be linked to each other to form a $C_{5-7}$ cycloalkene ring, the pyrylium ring and the thiapyrylium ring may have substituents, wherein adjacent two substituents may be linked to each other to form a condensed benzene ring, and $X^-$ is a counter anion.

Here, the substituent in $L^4$ of the formulae (IVa), (IVb) and (IVc) may, for example, be an alkyl group, an amino group or a halogen atom, and the substituents in the pyrylium ring and the thiapyrylium ring may, for example, be an aryl group such as a phenyl group or a naphthyl group.

The counter anion $X^-$ in the above formulae (Ia) to (Ic), (II), (III) and (IVa) to (IVc) may, for example, be an anion of an inorganic acid such as $Cl^-$, $Br^-$, $I^-$, $ClO_4^-$, $PF_6^-$ or of an inorganic boric acid such as $BF_4^-$ or $BCl_4^-$, or an anion of an organic acid such as benzenesulfonic acid, p-toluenesulfonic acid, naphthalenesulfonic acid, acetic acid, or an organic boric acid having an organic group such as a methyl, ethyl, propyl, butyl, phenyl, methoxyphenyl, naphthyl, difluorophenyl, pentafluorophenyl, thienyl or pyrrolyl group. Among them, a dye having a boric acid anion as the counter anion is preferred, since it is excellent in the solubility in the coating solvent, and it makes possible to use a low melting point solvent.

Now, specific examples will be shown for each of the quinoline dyes of the above formulae (Ia) to (Ic), the indole type or benzothiazole type dyes of the formula (II), the iminocyclohexadiene dyes of the formula (III) and the pyrylium type or thiapyrylium type dyes of the formula (IVa) to (IVc).

(I-1)

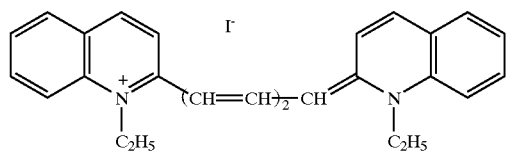

(I-2)

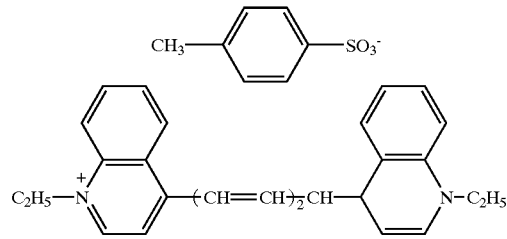

(I-3)

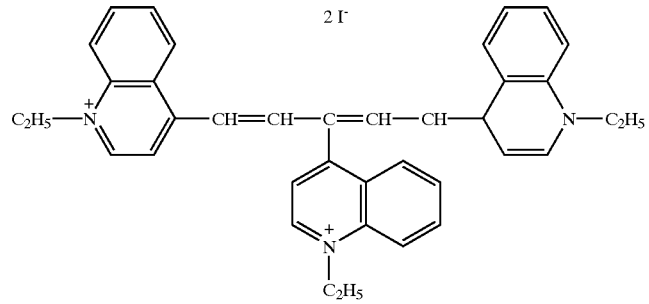

(I-4)

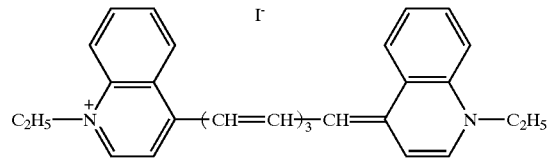

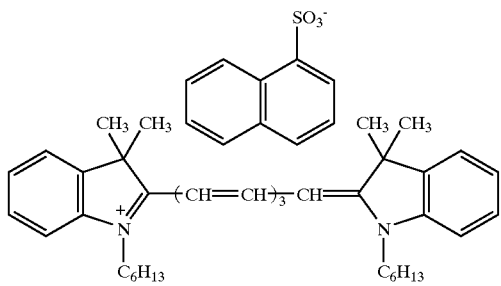
(II-1)
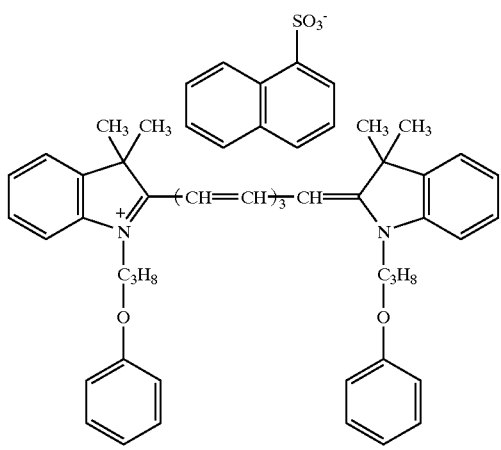
(II-2)
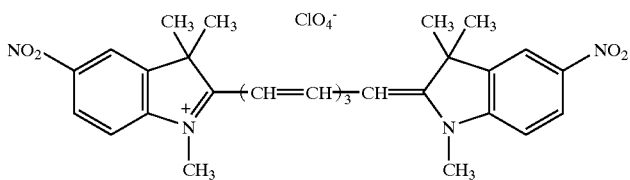
(II-3)
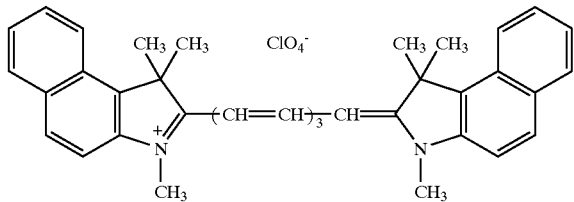
(II-4)
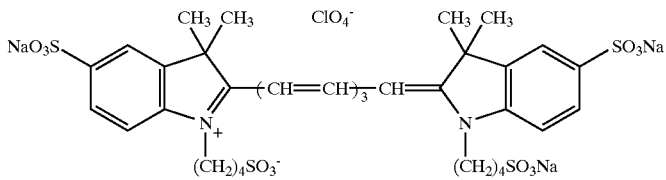
(II-5)

-continued
(II-6)
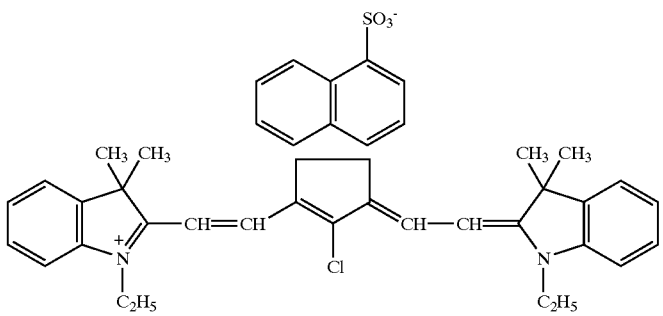
(II-7)
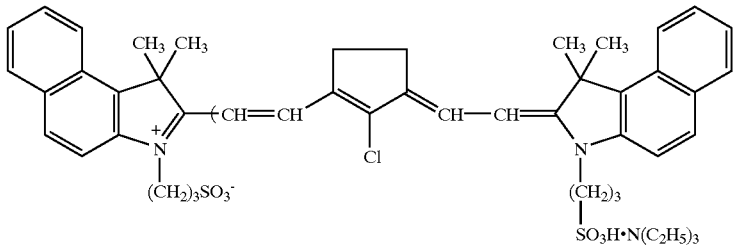
(II-8)
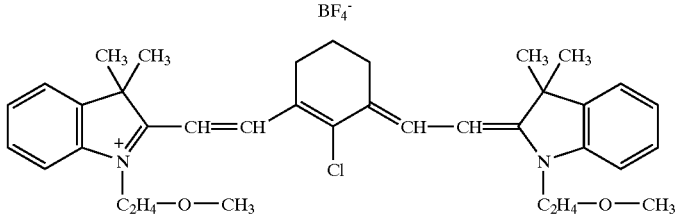
(II-9)
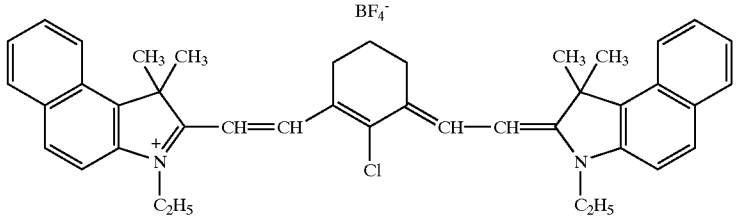
(II-10)
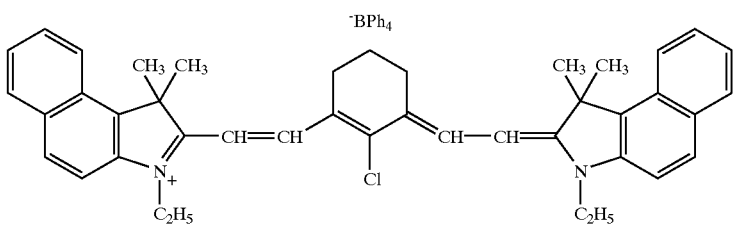
(II-11)
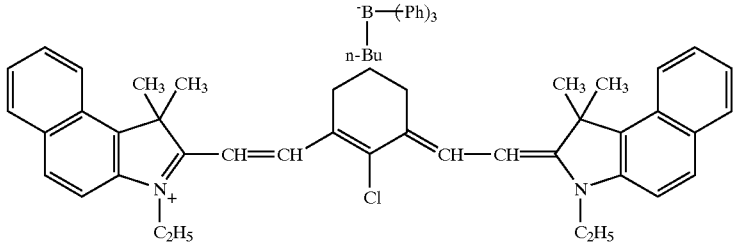

(II-12)
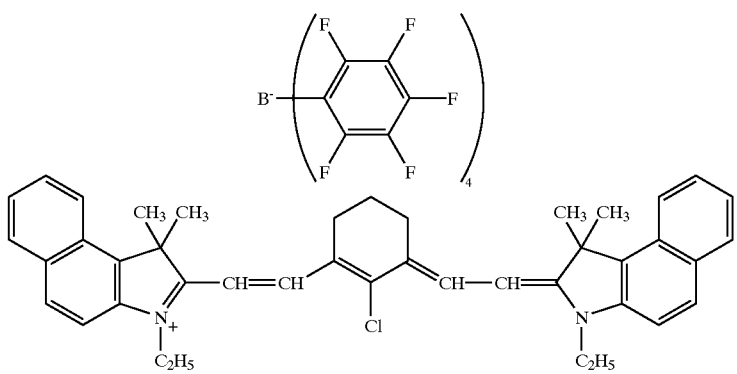
(II-13)
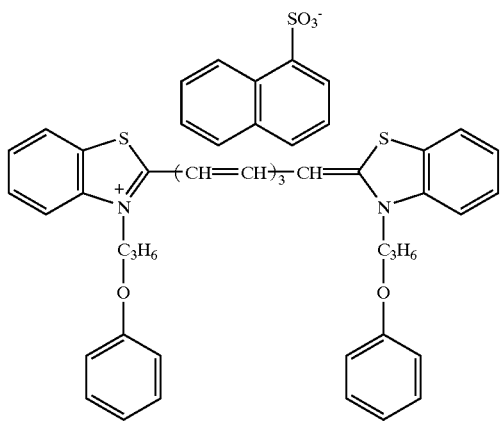
(II-14)
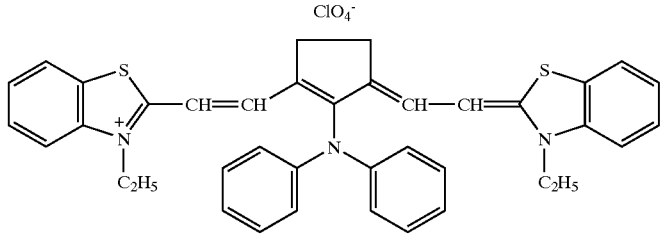
(II-15)
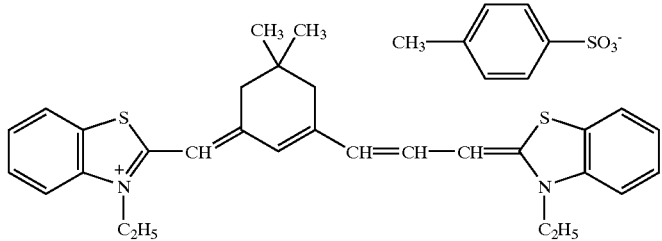
(III-1)
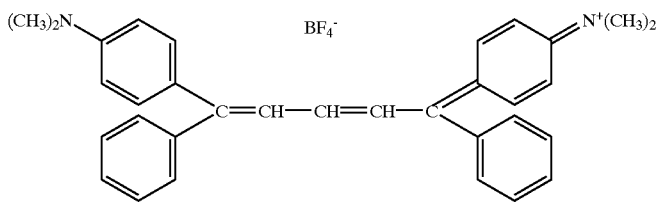

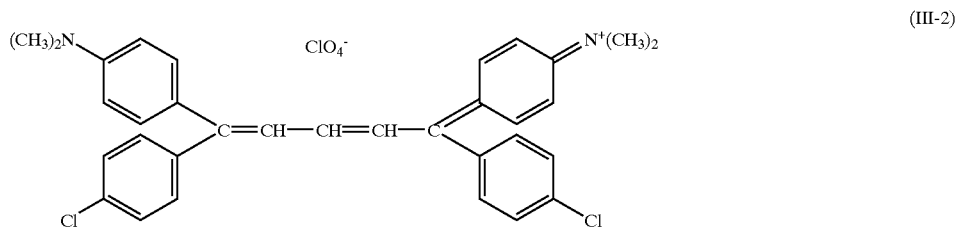
(III-2)
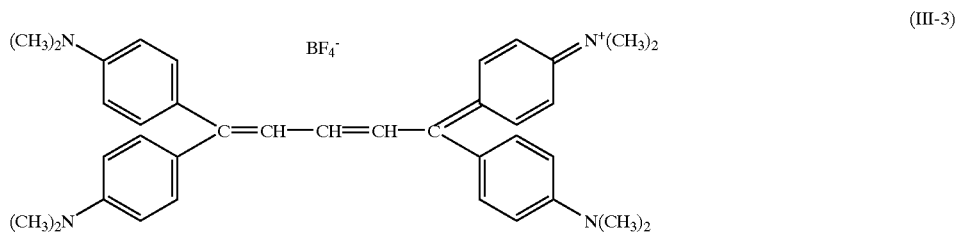
(III-3)
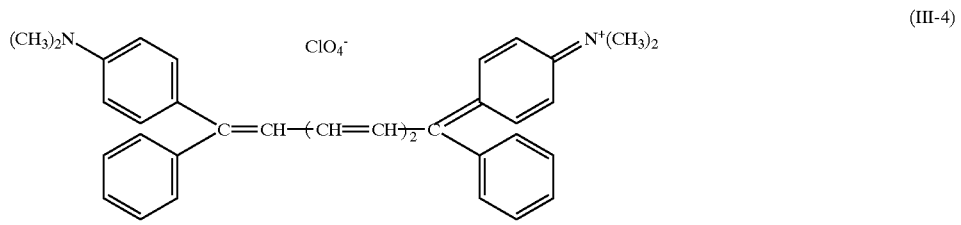
(III-4)
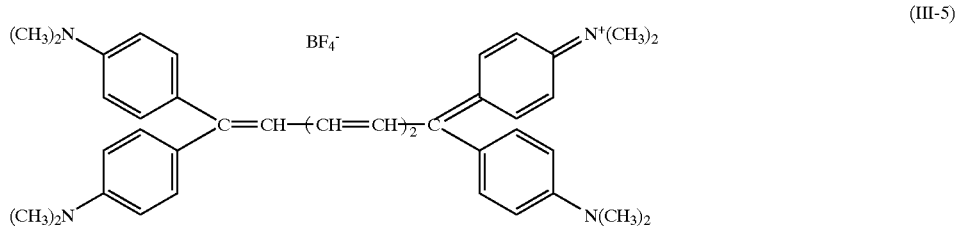
(III-5)
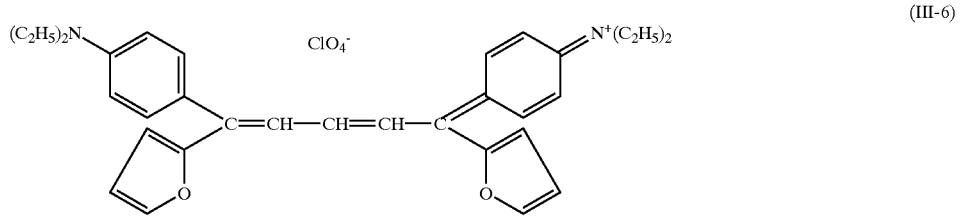
(III-6)
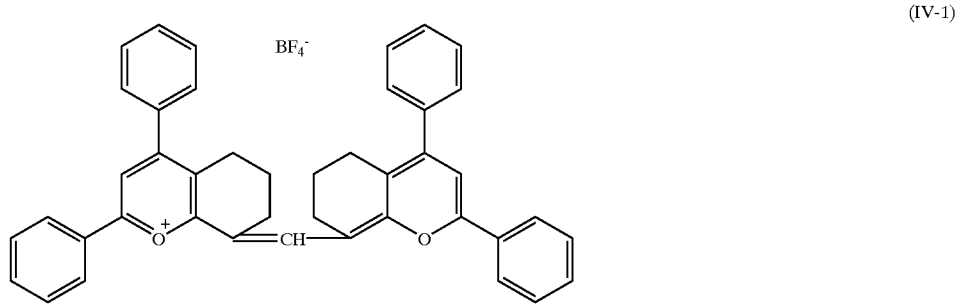
(IV-1)

-continued
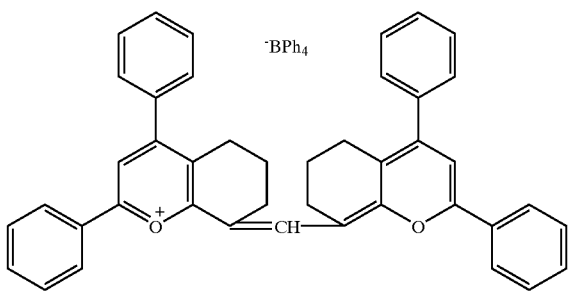
(IV-2)
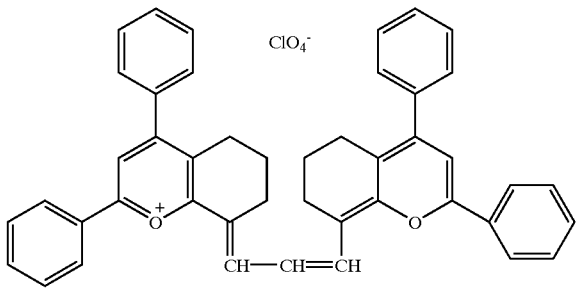
(IV-3)
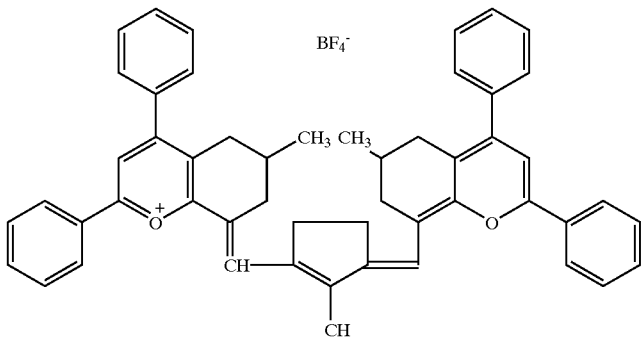
(IV-4)
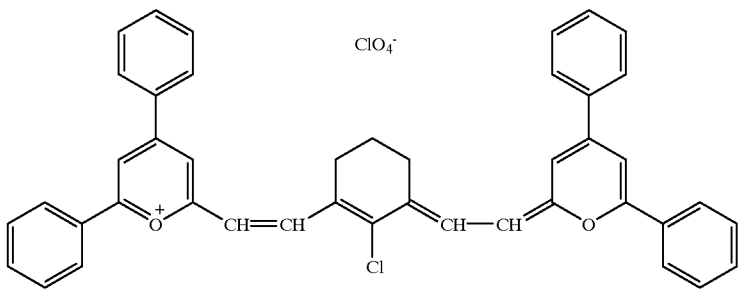
(IV-5)
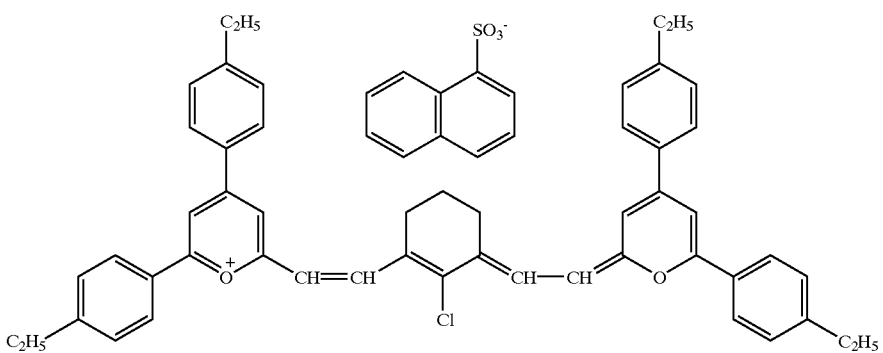
(IV-6)

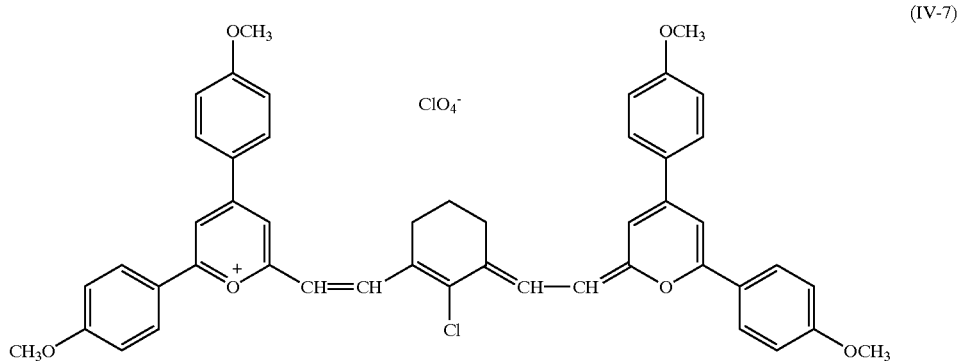
(IV-7)
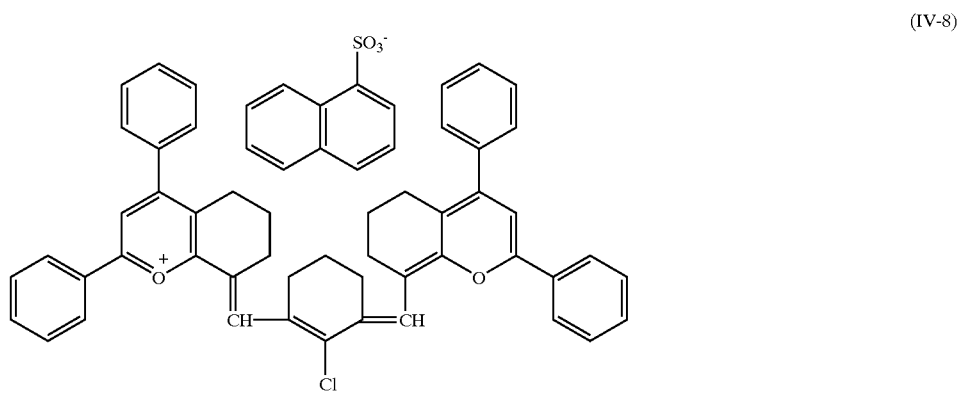
(IV-8)
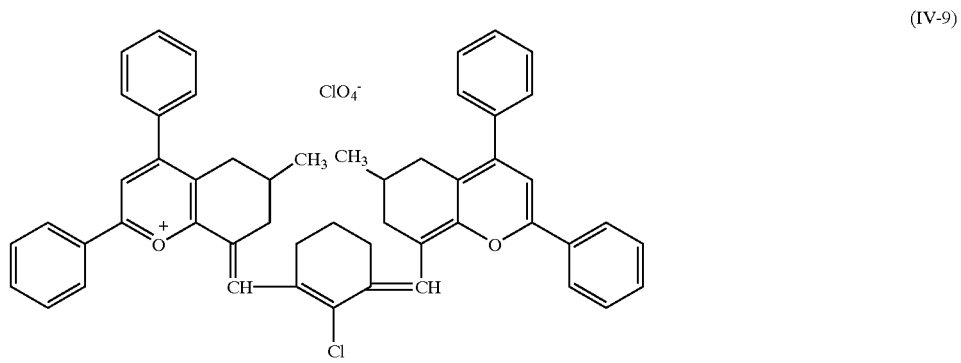
(IV-9)
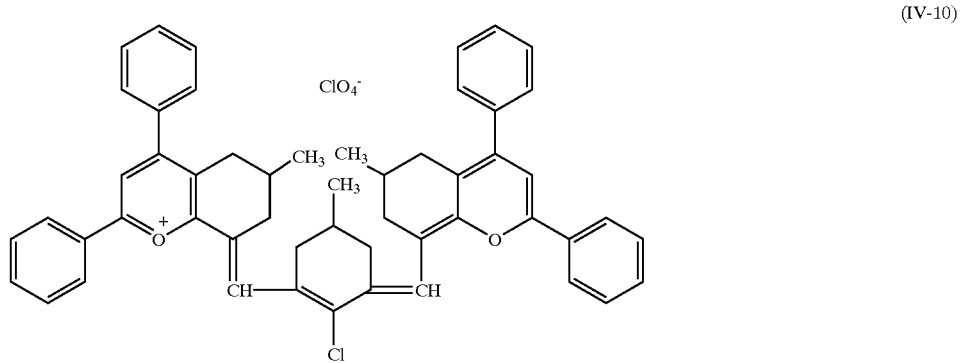
(IV-10)

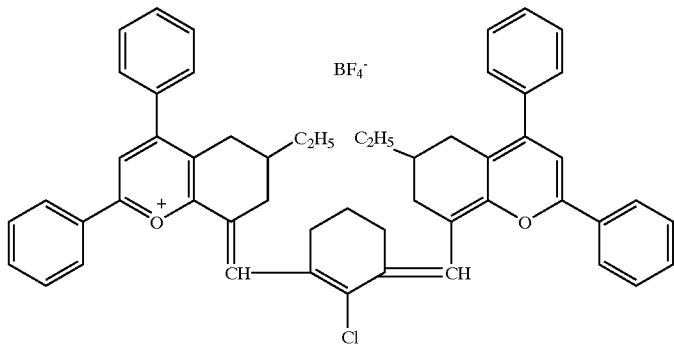
(IV-11)
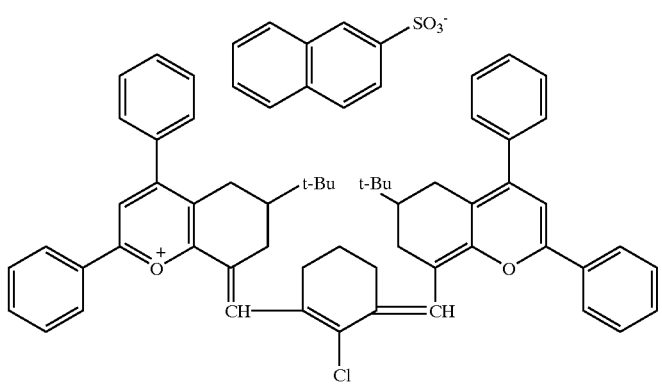
(IV-12)
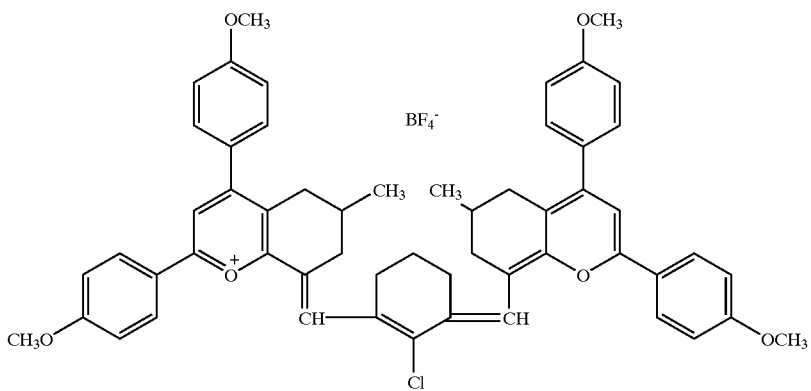
(IV-13)
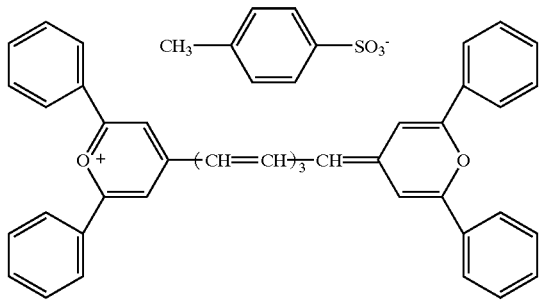
(IV-14)

-continued
(IV-15)
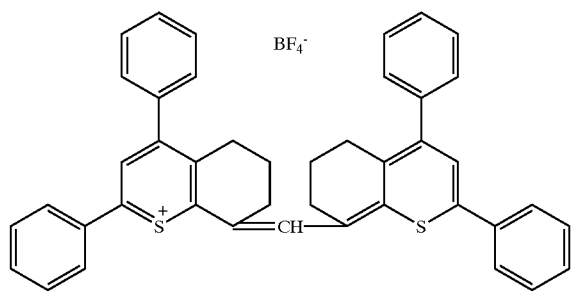
(IV-16)
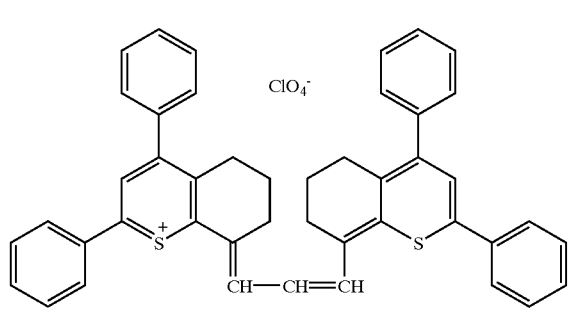
(IV-17)
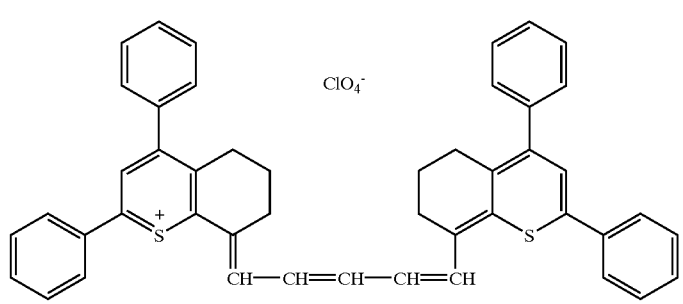
(IV-18)
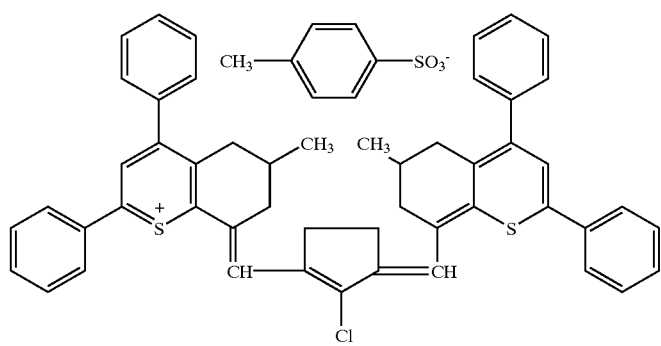
(IV-19)
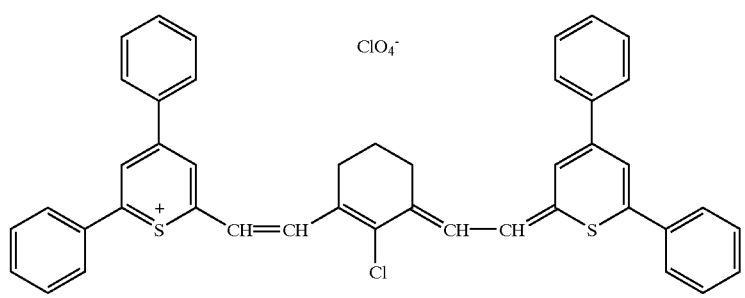

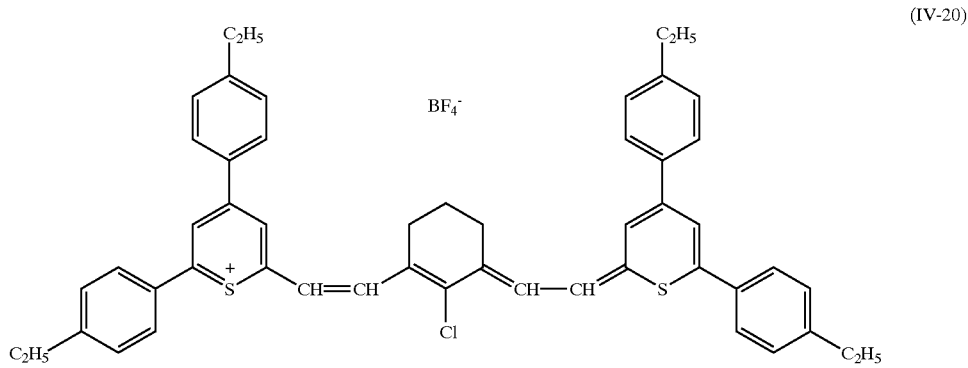
(IV-20)
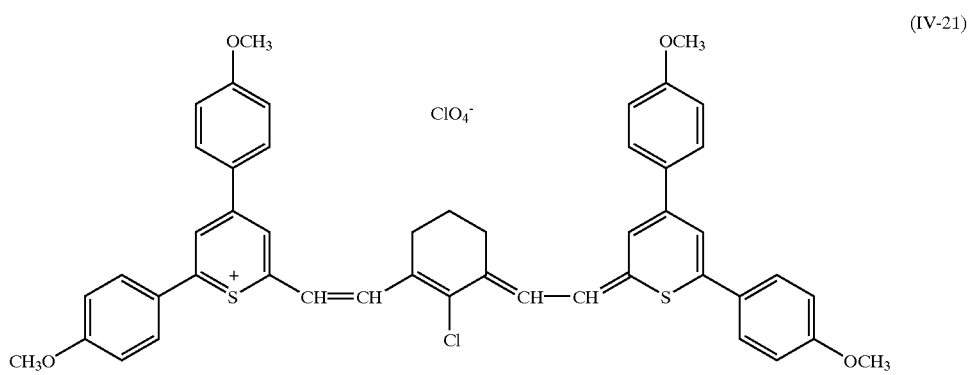
(IV-21)
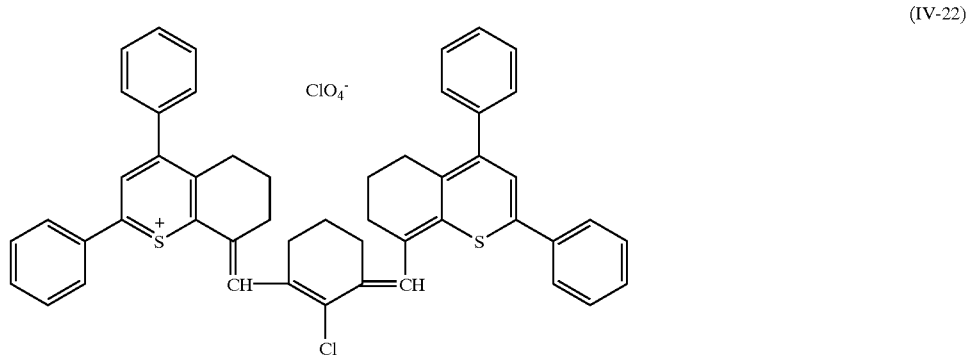
(IV-22)
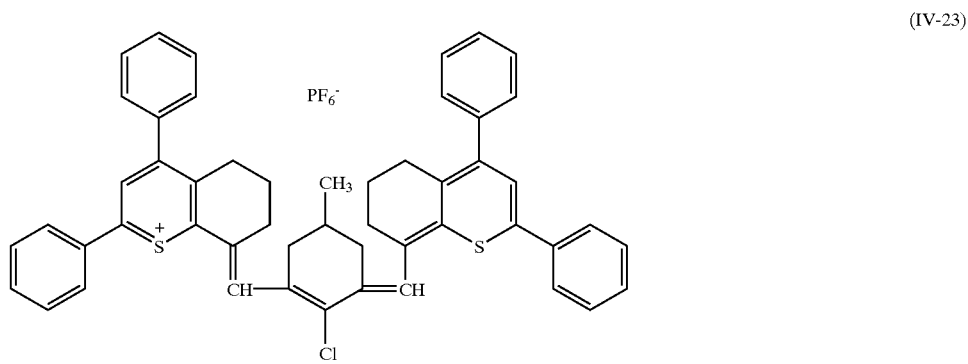
(IV-23)

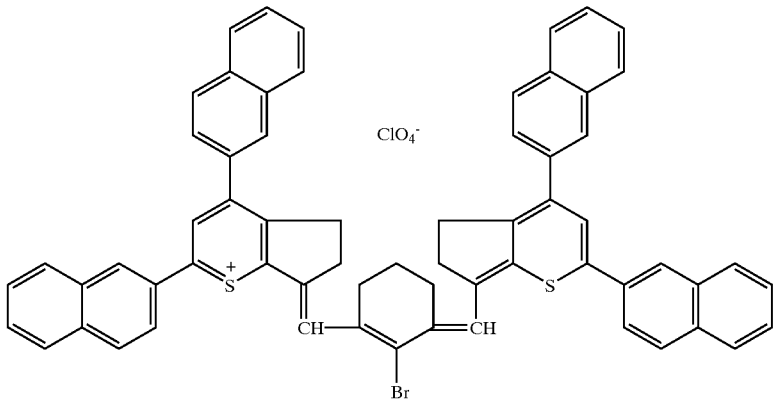

(IV-24)

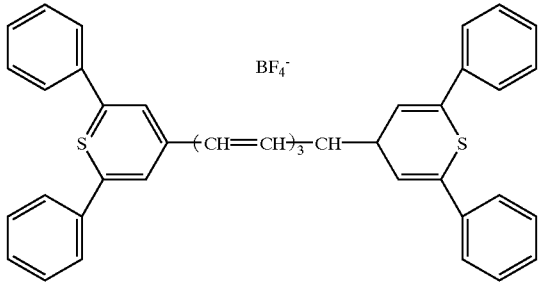

(IV-25)

Further, photo-thermal conversion materials disclosed in JP10-93179, JP10-163444 and JP10-222567 by the present applicant can also be suitably employed.

In the present invention, the content of the above photo-thermal conversion material in the positive photosensitive composition is usually from 0.5 to 50 wt %, preferably from 0.5 to 30 wt %, more preferably from 1 to 20 wt %, most preferably from 1 to 15 wt %.

In the present invention, the positive photosensitive composition further contains a novolak resin as an essential component. The novolak resin is a resin obtained by polycondensing at least one member of phenols such as phenol, o-cresol, m-cresol, p-cresol, 2,5-xylenol, 3,5-xylenol, o-ethylphenol, m-ethylphenol, p-ethylphenol, propylphenol, n-butylphenol, tert-butylphenol, 1-naphthol, 2-naphthol, resorcinol, 2,4'-biphenyldiol, bisphenol A and pyrogallol, with at least one member of aldehydes such as formaldehyde, acetaldehyde, propionaldehyde, benzaldehyde and furfural (instead of formaldehyde, paraformaldehyde may be employed, and likewise instead of acetaldehyde, paraldehyde may be employed) or ketones such as acetone, methyl ethyl ketone and methyl isobutyl ketone, in the presence of an acid catalyst. In the present invention, particularly preferred among them is a polycondensate of phenol, o-cresol, m-cresol, p-cresol, 2,5-xylenol, 3,5-xylenol and resorcinol, as the phenols, with formaldehyde, acetaldehyde and propionaldehyde, as the aldehydes or ketones. Particularly preferred is a polycondensate of a phenol mixture of m-cresol/p-cresol/2,5-xylenol/3,5-xylenol/resorcinol in a molar ratio of 40 to 100/0 to 50/0 to 20/0 to 20/0 to 20, or a phenol mixture of phenol/m-cresol/p-cresol in a molar ratio of 1 to 100/0 to 70/0 to 60, with formaldehyde. Further, the positive photosensitive composition of the present invention preferably contains a solubility-suppressing agent, which will be described hereinafter, and in such a case, preferred is a polycondensate of a phenol mixture of m-cresol/p-cresol/2,5-xylenol/3,5-xylenol/resorcinol in a molar ratio of 70 to 100/0 to 30/0 to 20/0 to 20/0 to 20, or a phenol mixture of phenol/m-cresol/p-cresol in a molar ratio of 10 to 100/0 to 60/0 to 40, with formaldehyde.

The weight average molecular weight calculated as polystyrene, measured by gel permeation chromatography, of the novolak resin is preferably from 1,000 to 15,000, particularly preferably from 1,500 to 10,000. If the molecular weight of the novolak resin is smaller than the above range, no adequate coating film tends to be obtained, and if it is larger than the above range, the solubility in the alkali developer tends to be small, whereby removal of the exposed portion tends to be inadequate, and the positive image tends to hardly be obtainable.

In the present invention, the content of the novolak resin in the positive photosensitive composition has a certain range depending upon whether or not the solubility-suppressing agent which will be described hereinafter, allowed to be incorporated to the composition, is an organic polymer. However, it is usually from 10 to 95 wt %, preferably from 20 to 95 wt %, more preferably from 40 to 90 wt %, most preferably from 60 to 85 wt %.

It is essential that the positive photosensitive composition constituting the positive photosensitive composition layer in the present invention does not contain a thermally decomposable material, as mentioned above. Here, the thermally decomposable material is a material which has a nature such that it decomposes by the heat generated by the above-mentioned photo-thermal conversion material upon absorption of light from the image exposure light source. Namely, the positive photosensitive composition layer in the present invention contains the photo-thermal conversion material, whereby heat will be generated at the exposed portion in the photosensitive composition layer upon absorption of light from the image exposure light source during the image exposure, but a compound decomposable by this heat is not contained in the positive photosensitive composition layer of the present invention.

Specifically, the thermally decomposable compound may, for example, be an onium salt, a diazonium salt or a quinonediazide compound as disclosed in JP-A-7-285275.

In the present invention, the positive photosensitive composition does not contain an onium salt, a diazonium salt and a quinonediazide compound and thereby has substantially no sensitivity to ultraviolet light. More specifically, this means that the composition exhibits no significant difference in the solubility in the alkali developer as between before and after irradiation with light with a wavelength of from 360 to 450 nm and thus it has no image-forming function in the practical sense.

In other words, the positive photosensitive composition of the present invention has a nature such that even when it is left to stand under white fluorescent light (36 W white fluorescent lamp Neolumi Super FLR40S-W/M/36, manufactured by Mitsubishi Denki K.K.) with a light intensity of 400 lux for 10 hours, it shows no substantial significant difference in the solubility in the alkali developer. Here, "no substantial significant difference in the solubility" means that the solubility in the alkali developer does not substantially change as between before and after it is left to stand for 10 hours.

In the present invention, the positive photosensitive composition may contain, in addition to the above-mentioned photo-thermal conversion material and the novolak resin, a colorant e.g. a pigment or a dye such as Victoria Pure Blue (42595), Auramine O (41000), Catiron Brilliant Flavin (basic 13), Rhodamine 6GCP (45160), Rhodamine B (45170), Safranine OK 70:100 (50240), Erioglaucine X (42080), Fast Black HB (26150), No. 120/Lionol Yellow (21090), Lionol Yellow GRO (21090), Simular Fast Yellow 8GF (21105), Benzidine Yellow 4T-564D (21095), Simular Fast Red 4015 (12355), Lionol Red B4401 (15850), Fastgen Blue-TGR-L (74160) or Lionol Blue SM (26150). Here, numerals in the brackets indicate the color indices (C.I.).

The content of the colorant in the positive photosensitive composition of the present invention is preferably from 0 to 50 wt %, more preferably from 2 to 20 wt %.

Further, the positive photosensitive composition in the present invention may contain a solubility-suppressing agent which has a function of lowering the solubility of the above-mentioned novolak resin when used in combination with the novolak resin and which does not substantially absorb light in a near infrared region and is not decomposed by the light in a near infrared region, for the purpose of increasing the difference in the solubility in the alkali developer as between the exposed portion and the non-exposed portion. Such a solubility-suppressing agent is considered to lower the solubility of the novolak resin in the alkali developer by forming a hydrogen bond with the novolak resin.

Such a solubility-suppressing agent may, for example, be a sulfonic acid ester, a phosphoric acid ester, an aromatic carboxylic acid ester, an aromatic disulfone, a carboxylic anhydride, an aromatic ketone, an aromatic aldehyde, an aromatic amine, an aromatic ether or the like, as disclosed in detail in JP9-205789 by the present applicant, an acid-color forming dye having a lactone skeleton, an N,N-diarylamide skeleton or a diarylmethylimino skeleton, as described in detail in JP9-291880 by the present applicant, or a base-color forming dye having a lactone skeleton, a thiolactone skeleton or a sulfolactone skeleton, as described in detail in JP9-301915 by the present applicant.

Further, as the solubility-suppressing agent, various surfactants may be mentioned. Among them, nonionic surfactants are preferred, such as, polyethylene glycols, polyethylene glycol polypropylene glycol block copolymers, polyethylene glycol alkyl ethers, polyethylene glycol polypropylene glycol alkyl ethers, polyethylene glycol alkylphenyl ethers, polyethylene glycol fatty acid esters, polyethylene glycol alkylamines, polyethylene glycol alkylaminoethers, glycerol fatty acid esters and their polyoxyethylene oxide adducts, sorbitan fatty acid esters and their polyethylene oxide adducts, sorbitol fatty acid esters and their polyethylene oxide adducts, pentaerythritol fatty acid esters and their polyethylene oxide adducts, and polyglycerol fatty acid esters. Such nonionic surfactants preferably have HLB of at least 8, more preferably HLB of at least 10.

Among the above, particularly preferred as the solubility-suppressing agent in the present invention are sulfonic acid esters, acid-color forming dyes having a lactone skeleton, and nonionic surfactants having HLB of at least 10, such as polyethylene glycols, polyethylene glycol polypropylene glycol block copolymers, polyethylene glycol alkyl ethers, polyethylene glycol alkylphenyl ethers, polyethylene glycol fatty acid esters, glycerol fatty acid esters and their polyethylene oxide adducts, sorbitan fatty acid esters and their polyethylene oxide adducts, sorbitol fatty acid esters and their polyethylene oxide adducts, pentaerythritol fatty acid esters, and polyglycerol fatty acid esters. Especially, acid-color forming dyes having a lactone skeleton are preferred.

In the present invention, the content of the solubility-suppressing agent in the positive photosensitive composition is preferably from 0 to 30 wt %, more preferably from 0 to 20 wt %, most preferably from 0 to 15 wt %.

Further, the positive photosensitive composition in the present invention may contain an organic acid having preferably a pKa of at least 2 or an anhydride of such an organic acid for the purpose of improving the developability such as imparting an under developability.

The organic acid or its anhydride may, for example, be those disclosed in JP-A-60-88942, JP-A-63-276048 and JP-A-2-96754. Specifically, it may, for example, be an aliphatic saturated carboxylic acid such as glyceric acid, methyl malonic acid, dimethyl malonic acid, propyl malonic acid, succinic acid, malic acid, mesotartaric acid, glutaric acid, β-methylglutaric acid, β,β-dimethylglutaric acid, β-ethylglutaric acid, β,β-diethylglutaric acid, β-propylglutaric acid, β,β-methylpropylglutaric acid, pimelic acid, suberic acid or sebacic acid, an aliphatic unsaturated carboxylic acid such as maleic acid, fumaric acid or glutaconic acid, a carbocyclic carboxylic acid such as 1,1-cyclobutanedicarboxylic acid, 1,3-cyclobutanedicarboxylic acid, 1,1-cyclopentanedicarboxylic acid, 1,2-cyclopentanedicarboxylic acid, 1,1-cyclohexanedicarboxylic acid, 1,2-cyclohexanedicarboxylic acid, 1,3-cyclohexanedicarboxylic acid or 1,4-cyclohexanedicarboxylic acid, a carbocyclic unsaturated carboxylic acid such as 1,2-cyclohexenedicarboxylic acid, 2,3-dihydroxybenzoic acid, 3,4-dimethylbenzoic acid, 3,4-dimethoxybenzoic acid, 3,5-dimethoxybenzoic acid, p-toluylic acid, 2-hydroxy-p-toluylic acid, 2-hydroxy-m-toluylic acid, 2-hydroxy-o-toluylic acid, mandelic acid, gallic acid, phthalic acid, isophthalic acid, or an anhydride such as merudoramic acid, ascorbic acid, succinic anhydride, glutaric anhydride, maleic anhydride, cyclohexenedicarboxylic anhydride, cyclohexanedicarboxylic anhydride or phthalic anhydride.

In the present invention, the content of the organic acid or its anhydride in the positive photosensitive composition is preferably from 0 to 30 wt %, more preferably from 0 to 20 wt %, most preferably from 0 to 10 wt %.

In addition to the above components, the positive photosensitive composition in the present invention may contain various additives which are commonly used, such as a dye, a pigment, a coating property-improving agent, a development-improving agent, an adhesion-improving agent, a sensitivity-improving agent and an oleophilic agent in an amount of not more than 20 wt %, preferably not more than 10 wt %, more preferably within a range of from 0.1 to 5 wt %.

The positive photosensitive composition in the present invention is coated on a substrate surface usually in the form of a solution having the above-described various components dissolved in a suitable solvent, followed by heating and drying, to obtain a positive image-forming material having a photosensitive composition layer on the substrate surface.

Here, the solvent is not particularly limited so long as it presents adequate solubility to the components used and provides an excellent coating property. For example, it may be a cellosolve solvent such as ethylcellosolve, ethylcellosolve, methylcellosolve acetate or ethylcellosolve acetate, a propylene glycol solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester solvent such as butyl acetate, amyl acetate, ethyl lactate, butyl lactate, diethyl oxalate, ethyl pyruvate, ethyl-2-hydroxy butyrate, ethyl acetoacetate, methyl lactate, ethyl lactate or methyl 3-methoxypropionate, an alcohol solvent such as heptanol, hexanol, diacetone alcohol or furfuryl alcohol, a ketone solvent such as cyclohexanone or methyl amyl ketone, a highly polar solvent such as dimethylformamide, dimethylacetamide or N-methylpyrrolidone or a solvent mixture thereof, or a mixture thereof with an aromatic hydrocarbon. The proportion of the solvent is usually within a range of from 1 to 200 times by weight, to the total amount of the photosensitive composition.

As the coating method, a conventional method such as rotational coating, wire bar coating, dip coating, air knife coating, roll coating, blade coating or curtain coating may, for example, be employed. The coating amount varies depending upon the particular application, but is usually within a range of from 0.3 to 7 μm, preferably from 0.5 to 5 μm, more preferably from 1 to 3 μm, as a dried film thickness. The temperature for drying at that time is, for example, at a level of from 60 to 170° C., preferably from 70 to 150° C., and the drying time is, for example, at a level of from 5 seconds to 10 minutes, preferably from 10 seconds to 5 minutes.

Further, it is preferred to carry out post heat treatment at a temperature of from about 40 to 120° C., preferably from about 40 to 70° C. for from about 5 minutes to 100 hours, preferably from about 30 minutes to 75 hours, for the purpose of e.g. improving the contrast at the time of the image forming and improving the stability with time of the image-forming property.

The substrate may, for example, be a metal plate of e.g. aluminum, zinc, copper or steel, a metal plate having aluminum, zinc, copper, iron, chromium or nickel plated or vapor-deposited thereon, a paper sheet, a paper sheet having a resin coated thereon, a paper sheet having a metal foil of e.g. aluminum bonded thereto, a plastic film, a plastic film having hydrophilic treatment applied thereto, or a glass plate. Among them, preferred is an aluminum plate. More preferred is an aluminum plate having grain treatment applied by brush polishing or electrolytic etching in a hydrochloric acid or nitric acid solution, having anodizing treatment applied in a sulfuric acid solution and, if necessary, having surface treatment such as pore sealing treatment applied. When an aluminum substrate is used as the substrate, any conventional aluminum substrate commonly used for printing plates may be employed, such as a A1000 (pure aluminum) type, a A3000 (Al—Mn) type or a A5000 (Al—Mg) type, as stipulated in JIS. The surface roughness of the substrate is usually from 0.3 to 1.0 μm, preferably from 0.4 to 0.8 μm, as the average roughness $R_a$ as stipulated in JIS B0601.

In the present invention, the light source for image exposure of the positive photosensitive composition layer is mainly a laser light source such as a HeNe laser, an argon ion laser, a YAG laser, a HeCd laser, a semiconductor laser or a ruby laser. Especially when an image is to be formed by heat generated upon absorption of light, it is preferred to employ a light source capable of generating a near infrared laser beam of from 650 to 1,300 nm, such as a ruby laser, a YAG laser, a semiconductor laser or a solid laser such as LED, particularly preferably a semiconductor laser or a YAG laser, which is small in size and has a long useful life. With such a light source, scanning exposure is usually carried out, and then development is carried out with a developer to form an image.

The laser light source is used to scan the surface of the photosensitive composition layer usually in the form of a high intensity light ray (beam) focused by a lens, and the sensitivity characteristic (mJ/cm$^2$) of the photosensitive composition layer in the present invention responding thereto may sometimes depend on the light intensity (mJ/s·cm$^2$) of the laser beam. Here, the light intensity of the laser beam can be obtained by dividing the energy per unit time (mJ/s) of the laser beam measured by a light power meter by the irradiation area (cm$^2$) of the laser beam on the surface of the photosensitive composition layer. The irradiation area of the laser beam is usually defined by the area of the portion exceeding 1/e$^2$ intensity of the laser peak intensity, but it may simply be measured by sensitizing the photosensitive material showing reciprocity law.

In the present invention, the light intensity of the light source is preferably at least 2.0×10$^6$ mJ/s·cm$^2$, more preferably at least 1.0×10 mJ/s·cm$^2$. If the light intensity is within the above range, it is possible to improve the sensitivity characteristic of the positive photosensitive composition layer in the present invention, and the scanning exposure time can be shortened, such being practically very advantageous.

The developer to be used for developing the positive image forming material having the positive photosensitive composition layer subjected to image exposure in present invention, is an alkali developer which is an aqueous solution containing from about 0.1 to 5 wt % of an inorganic alkali salt such as sodium silicate, potassium silicate, lithium silicate, ammonium silicate, sodium metasilicate, potassium metasilicate, sodium hydroxide, potassium hydroxide, lithium hydroxide, sodium carbonate, sodium hydrogencarbonate, potassium carbonate, sodium secondary phosphate, sodium tertiary phosphate, ammonium secondary phosphate, ammonium tertiary phosphate, sodium borate, potassium borate or ammonium borate, or an organic amine compound such as monomethylamine, dimethylamine, trimethylamine, monoethylamine, diethylamine, triethylamine, monoisopropylamine, diisopropylamine, monobutylamine, monoethanolamine, diethanolamine, triethanolamine, monoisopropanolamine or diisopropanolamine. Among them, particularly preferred is an alkali developer containing a silicate of an alkali metal such as sodium silicate, potassium silicate or lithium silicate, as an inorganic alkali salt.

The developer in the present invention is preferably such that the silicate of an alkali metal is in an amount of from 0.1 to 5 wt % as the content of silicon dioxide, and the ratio ($[SiO_2]/[M]$) of the molar concentration of silicon dioxide ($[SiO_2]$) to the molar concentration of the alkali metal ($[M]$) is from 0.1 to 1.5. Particularly preferred is such that the content is from 0.2 to 3 wt % as silicon dioxide, and the ratio of the molar concentration of silicon dioxide to the molar concentration of the alkali metal is from 0.2 to 1.0.

If the ratio of $[SiO_2]/[M]$ is too low, the development-treating speed decreases, the solubility of the non-image area during development becomes poor (background fogging), and ink stain to the non-image area during printing (printing stain) is likely to take place. On the other hand, if the ratio of $[SiO_2]/[M]$ is too high, precipitation of the alkali metal salt during the storage of the developer is likely to take place, which is problematic.

Among the above-mentioned developers, one containing a hydroxide of an alkali metal and a silicate of an alkali metal, is preferred, since it is excellent in the solubility of the alkali salt in water, and preparation of the developer is easy.

Further, the alkali developer in the present invention preferably has a pH of at least 12, particularly preferably a pH of from 12.5 to 14.0. If the pH is less than the above range, the removal of the exposed portion tends to be poor, and if the pH is too high, insoluble matters are likely to form in the developer. In either case, the allowance for the developing conditions will be narrow.

In the present invention, it is essential to incorporate an amphoteric surfactant to the developer. With a developer not containing an amphoteric surfactant, the object of the present invention i.e. to attain a good remaining ratio of the coating film amount and yet to attain good scratch resistance, can not be accomplished. Further, by the incorporation of an amphoteric surfactant to the developer, improvement in the sensitivity and the developing speed, improvement in the development-treating ability of the developer (the development treating area of the photosensitive layer) and suppression of the deterioration with time of the developer, will be observed.

The amphoteric surfactant may, for example, be a betaine type compound such as N-lauryl-N,N-dimethyl-N-ammonium, N-stearyl-N,N-dimethyl-N-carboxyammonium, N-lauryl-N,N-dihydroxyethyl-N-carboxymethylammonium, N-lauryl-N,N-dihydroxyethyl-N-carboxymethylammonium or N-lauryl-N,N-tris(carboxymethyl)ammonium, or an imidazoline type compound such as sodium N-coconut oil fatty acid acyl-N-carboxymethyl-N-hydroxyethylethylenediamine.

Among the above surfactants, a betaine type compound is particularly preferred.

The above surfactant is incorporated to the alkali developer usually in an amount of from 0.0001 to 20 wt %, preferably from 0.0005 to 10 wt %, more preferably from 0.001 to 5 wt %, most preferably from 0.001 to 1 wt %.

If the content is less than the above range, the effects of the present invention may not adequately be obtained, and if it is too much, a problem of foaming or a film reduction at the non-exposed portion of the photosensitive layer, is likely to result, whereby continuous treatment for development tends to be difficult, and reproducibility of the image of the photosensitive layer tends to be poor. Further, when the content is within the above range, the allowance for the development conditions will be broadened.

Further, the alkali developer to be used for development of a positive photosensitive material having the positive photosensitive composition layer subjected to image exposure in the present invention, preferably contains a silicone. By the incorporation of the silicone, the film reduction at the non-exposed portion can further be suppressed, whereby the allowance for the developing conditions can be broadened.

The silicone is preferably one having a siloxane bond as the skeleton, specifically a silicone oil having dimethylpolysiloxane or a main chain having part of methyl groups thereof substituted by hydrogen or phenyl groups, or a silicone oil used as a solution type, an emulsion type or a compound type in a silicone resin, is preferred. Among them, one used as a defoaming agent is preferred. Particularly preferred is one having self emulsifiable hydrophilic groups, such as a copolymer of a dimethylpolysiloxane with a polyalkylene oxide.

In the present invention, the content of the silicone in the alkali developer is preferably from 1 to 10,000 ppm, more preferably from 5 to 1,000 ppm.

In addition to the above alkali agent and the above surfactant, the developer of the present invention may further contain an additive, as the case requires, such as a water soluble organic solvent such as a polyhydric alcohol, an aromatic alcohol or an alicyclic alcohol, a hard water softening agent such as a polyphosphate, an amino polycarboxylate or an organic sulfonate, a reducing agent such as a phenolic compound, an amine compound, a sulfite, a phosphite or a thiophosphate, a chelating agent such as an organic sulfonic acid, a phosphonoalkane tricarboxylic acid or a salt thereof, an alkali-soluble mercapto compound, a pH controlling agent such as an inorganic acid, an organic acid or a salt thereof, or a defoaming agent such as an organic silane compound.

These additives may be contained in the alkali developer in a concentration of preferably from 0.001 to 5 wt %, more preferably from 0.005 to 3 wt %.

The development is carried out usually at a temperature of from 10 to 50° C., preferably from 15 to 45° C., by e.g. dip development, spray development, brush development or supersonic development.

The present invention employs a photo-thermal conversion material and a novolak resin as the basic composition, whereby a positive image can be formed with a very simple system where no chemical change can be expected. This image formation is carried out by a change other than a chemical change. This is evident also from a reversible phenomenon observed such that when the photosensitive composition of the present invention which was once subjected to irradiation with light, is heated at a temperature of about 50° C. for 24 hours, the alkali solubility at the exposed portion which once increased immediately after the exposure often returns to a state close to the state before the exposure. Further, this is also evident from the relation between the glass transition temperature or the softening point of the photosensitive composition of the present invention and the likeliness of the reversible phenomenon, such that the lower the glass transition temperature or the softening temperature, the more likely the reversible phenomenon.

The reason as to why the photosensitive composition of the present invention forms a positive image by such a mechanism, is not clearly understood. However, it is considered that light energy absorbed by the photo-thermal conversion material is converted to heat, and the alkali-soluble polymer material at the portion receiving the heat undergoes a certain change other than the chemical change, such as a conformation change, whereby the alkali solubility at that portion will increase and thus an image is formed by the alkali developer. The details of this explanation are disclosed in JP9-205789 by the present applicant.

Further, in the photosensitive composition layer based on the action of a photo-thermal conversion material as in the present invention, the light absorption efficiency is low in the vicinity of the interface with the substrate, as compared with in the vicinity of the surface of the photosensitive composition layer, and at the same time, the heat generated upon absorption of light undergoes heat diffusion to the substrate, whereby the effect of imparting the solubility in the developer is small. Thus, by adopting the specific developing conditions, the present invention has solved a conventional problem such that the removal of the photosensitive layer at the exposed portion tends to be inadequate in the vicinity of the substrate, whereby the contrast between the exposed portion and the non-exposed portion tends to be poor, or if adequate removal of the exposed portion is sought, a film reduction at the non-exposed portion is likely to result.

Now, the present invention will be described in further detail with reference to Examples. However, it should be understood that the present invention is by no means restricted by specific Examples.

The alkali developers used, were as follows.

① An aqueous solution containing 1.0 wt % of sodium silicate ($SiO_2/Na_2O=3/1$ (weight ratio), the same applies hereinafter), 1.0 wt % of sodium hydroxide and 0.01 wt % of a betaine type amphoteric surfactant ("Anhytol 24B", manufactured by Kao Corporation). ($[SiO_2]/[M]=0.37$)

② An aqueous solution containing 1.0 wt % of sodium silicate, 1.0 wt % of sodium hydroxide and 0.01 wt % of a betaine type amphoteric surfactant ("Anhytol 86B", manufactured by Kao Corporation). ($[SiO_2]/[M]=0.37$)

③ An aqueous solution containing 1.0 wt % of sodium silicate, 1.0 wt of sodium hydroxide and 0.01 wt % of a polyoxyalkylene type nonionic surfactant ("Emulgen A-60" manufactured by Kao Corporation). ($[SiO_2]/[M]=0.37$)

④ An aqueous solution containing 1.0 wt % of sodium silicate, 1.0 wt % of sodium hydroxide and 0.01 wt % of a polyoxyalkylene type nonionic surfactant ("Emulgen PP-150" manufactured by Kao Corporation). ($[SiO_2]/[M]=0.37$)

⑤ An aqueous solution containing 1.0 wt % of sodium silicate, 1.0 wt % of sodium hydroxide and 0.01 wt % of a sodium sulfonate type anionic surfactant ("Perex NBL" manufactured by Kao Corporation). ($[SiO_2]/[M]=0.37$)

⑥ An aqueous solution containing 1.0 wt % of sodium silicate, 1.0 wt % of sodium hydroxide and 0.01 wt % of a sodium sulfonate type anionic surfactant ("Perex SS-H" manufactured by Kao Corporation). ($[SiO_2]/[M]=0.37$)

⑦ An aqueous solution containing 1.0 wt % of sodium silicate and 1.0 wt % of sodium hydroxide. ($[SiO_2]/[M]=0.37$)

In each of the above developers ① to ⑦, the silicon content was 0.75 wt % as silicon dioxide.

EXAMPLE 1

An aluminum plate (material: 1050, hardness: H16) having a thickness of 0.24 mm was subjected to degreasing treatment at 60° C. for one minute in a 5 wt % sodium hydroxide aqueous solution and then to electrolytic etching treatment in an aqueous hydrochloric acid solution having a concentration of 0.5 mol/l at a temperature of 28° C. at a current density of 60 A/dm² for a treating time of 40 seconds. Then, it was subjected to desmut treatment in a 4 wt % sodium hydroxide aqueous solution at 60° C. for 12 seconds and then to anodizing treatment in a 20 wt % sulfuric acid solution at a temperature of 20° C. at a current density of 3.5 A/dm² for a treating time of one minute. Further, it was subjected to a hydrothermal pore sealing treatment with hot water of 80° C. for 20 seconds to obtain an aluminum plate as a substrate for a lithographic printing plate. The value of average roughness Ra of this plate by a surface roughness meter ("SE-3DH", manufactured by Kosaka Kenkyusho) was 0.60 µm.

On the surface of the obtained aluminum plate substrate, a coating liquid having dissolved in 900 parts by weight of cyclohexanone, 100 parts by weight of novolak resin (Mw 4000) composed of a polycondensate of phenol mixture of phenol/m-cresol/p-cresol in a molar ratio of 20/50/30, with formaldehyde, as an alkali-soluble organic polymer material, 10 parts by weight of an indole type dye shown in the foregoing specific example (II-9), as a photo-thermal conversion material, and 10 parts by weight of an acid color forming dye of the following structure having a lactone skeleton, was coated by a wire bar, then dried at 90° C. for 2 minutes and subjected to post treatment at 55° C. for 16 hours to obtain a positive photosensitive lithographic printing plate having a positive photosensitive composition layer with a coating film amount of 2.8 g/m².

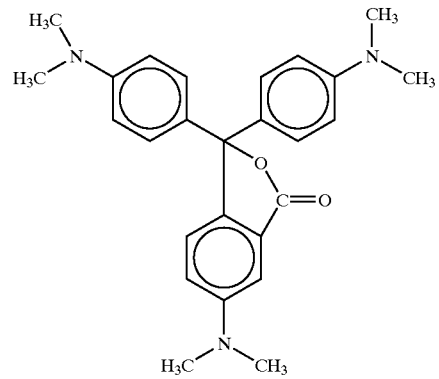

The obtained positive photosensitive lithographic printing plate was subjected to image exposure to form 212 lines and 3 to 97% dot images with various exposure energies by means of an exposure apparatus using a semiconductor laser of 830 nm as the light source ("Trendsetter 3244T", manufactured by Creo Products Inc.) to obtain a positive photosensitive material, which was dipped in the alkali developer shown in Table 1 for development, whereby the sensitivity, the film-remaining ratio and the scratch resistance were evaluated by the following methods, and the results are shown in Table 1.

Sensitivity

After developer immersion at 28° C. for 30 seconds, development was carried out by rubbing with a sponge for 5 times. The exposure (mJ/cm²) to reproduce the 3% dot image was defined as a sensitivity.

Film-remaining Ratio

The reflection densities before and after development of the image area of a sample after exposure were measured by a reflection densitometer manufactured by Macbeth Co., and the film-remaining ratio was calculated by the following formula.

Film remaining ratio (%)=Reflection density of the image area after development−Reflection density of the non-image area
Reflection density of the image area before development−Reflection density of the non-image area A: A film-remaining ratio of at least 95%.

B: A film-remaining ratio of at least 90% and less than 95%.

C: A film-remaining ratio of at least 70% and less than 90%.

D: A film-remaining ratio of less than 70%.

Scratch Resistance

Image exposure was carried out at an exposure for the above sensitivity, and development was carried out by developer immersion at 28° C. for 60 seconds, followed by rubbing with a sponge for 5 times, whereupon the surface of the image area of 25 cm² was visually observed, and the presence or absence of linear scratch marks were evaluated by the following standards. The one with scratch marks is inferior in the image reproducibility.

A: No scratch marks.

B: Less than 5 scratch marks.

C: At least 5 and less than 20 scratch marks.

D: At least 20 scratch marks.

EXAMPLES 2 AND 3

A positive photosensitive material was prepared in the same manner as in Example 1 except that the solubility-suppressing agent in the photosensitive composition layer was changed to an acid color forming dye of the following structure having a lactone skeleton, and the alkali developer as identified in Table 1 was used, and the developability was evaluated. The results are shown in Table 1.

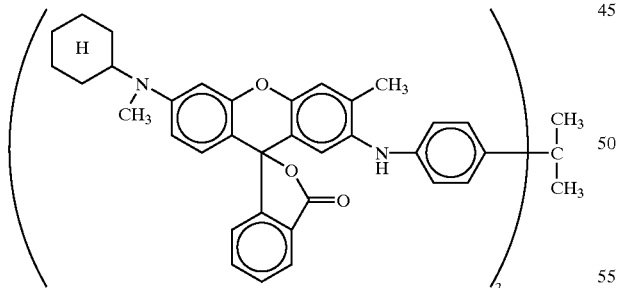

EXAMPLES 4 to 5

Comparative Examples 1 to 5

A positive photosensitive material was prepared in the same manner as in Example 1 except that in the photosensitive composition layer, the solubility-suppressing agent was changed to 5 parts by weight of the same acid-forming dye as used in Examples 2 and 3, and further 5 parts by weight of a nonionic surfactant ("Leodol 430", manufactured by Kao Corporation) was added, and the alkali developer as identified in Table 1 was used, and the developability was evaluated. The results are shown in Table 1.

TABLE 1

| | Developer | Sensitivity (mJ/cm²) | Film-remaining ratio | Scratch marks | Surfactant | Content of surfactant (wt %) |
|---|---|---|---|---|---|---|
| Example 1 | ① | 300 | A | A | Amphoteric | 0.01 |
| Example 2 | ① | 200 | A | A | Amphoteric | 0.01 |
| Example 3 | ② | 300 | A | A | Amphoteric | 0.01 |
| Example 4 | ① | 200 | A | A | Amphoteric | 0.01 |
| Example 5 | ② | 200 | A | A | Amphoteric | 0.01 |
| Comparative Example 1 | ⑦ | —* | D | D | Nil | 0 |
| Comparative Example 2 | ③ | 500 | B | B | Nonionic | 0.01 |
| Comparative Example 3 | ④ | 500 | B | B | Nonionic | 0.01 |
| Comparative Example 4 | ⑤ | 300 | A | B | Anionic | 0.01 |
| Comparative Example 5 | ⑥ | 300 | A | B | Anionic | 0.01 |

*Removal of the exposed portion was incomplete, and it was impossible to form an image.

Reference Example 1

The photosensitive lithographic printing plate of Example 1 was left to stand under a white fluorescent lamp with a light intensity of 400 lux (36 W white fluorescent lamp Neolumi Super FLR40S-W/M/36, manufactured by Mitsubishi Denki K.K.) for 10 hours, whereupon the same evaluation as in Example 1 was carried out, whereby the sensitivity, the film-remaining ratio and the scratch resistance were found to be equal to those in Example 1. On the other hand, a photosensitive lithographic printing plate was prepared and evaluated in the same manner as in Example 1 except that 10 parts by weight of the following o-quinonediazide was added to the photosensitive composition, whereby the sensitivity was 350 mJ/cm², the film-remaining ratio was A, and the scratch mark defect was A.

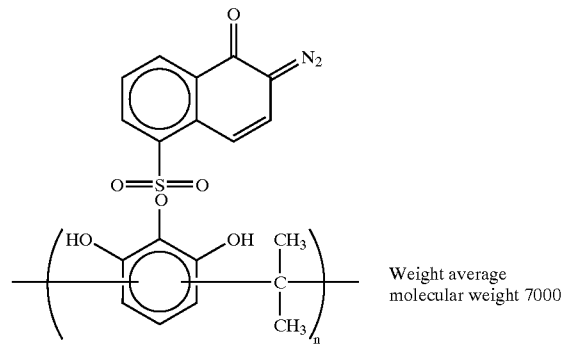

Weight average molecular weight 7000

However, when the sample containing the o-quinonediazide was left to stand for 5 hours under the above white fluorescent lamp and evaluated in a similar manner, a remarkable film reduction of the photosensitive layer resulted, and evaluation of the sensitivity and the scratch mark defect was impossible.

EXAMPLES 6 TO 18

An aluminum plate (thickness 0.24 mm) was subjected to degreasing treatment at 60° C. for one minute in a 3 wt % sodium hydroxide bath and then to electrolytic etching treatment in a hydrochloric acid bath having a concentration of 12 g/l at 25° C. at a current density of 80 A/dm² for 10 seconds. After washing with water, it was subjected to desmut treatment in a sodium hydroxide bath having a concentration of 10 g/l at 50° C. for 3 seconds and after washing with water, to anodizing treatment in a 30 wt % sulfuric acid bath at 300° C. at a current density of 10 A/dm² for 15 seconds. Further, it was subjected to a hydrothermal pore sealing treatment at 90° C. at pH 9 and washed with water and dried to obtain an aluminum plate as a substrate for a lithographic printing plate.

On the surface of the obtained aluminum plate substrate, a coating liquid having dissolved in 1,000 parts by weight of methylcellosolve, 4 parts by weight of a indole type dye ("CY-10", manufactured by Nippon Kayaku K.K.) shown in the above specific example (II-8), as a photo-thermal conversion material, 100 parts by weight of a novolak resin (Mw 9400, "SK-188", manufactured by Sumitomo Durez K.K.) obtained by polycondensation of a phenol mixture of phenol/m-cresol/p-cresol in a molar ratio of 50/30/20, with formaldehyde, as an alkali-soluble organic polymer material, 4 parts by weight of polyethylene glycol ("PEG#2000", manufactured by Toho Chemical Industry Co., Ltd.) as a solubility-suppressing agent and 5 parts by weight of 1,2-cyclohexanedicarboxylic acid as a developing property-improving agent, was coated by a wire bar and dried to obtain a positive photosensitive lithographic printing plate having a positive photosensitive composition layer with a dried film thickness of 2.5 g/m².

With respect to the obtained positive photosensitive lithographic printing plate, exposure was carried out with 200 mJ/cm² by means of a laser exposure machine ("Trendsetter 3244T", manufactured by Creo Products Inc.), and then development was carried out by means of a developer prepared by adding a silicone as identified in Table 1 to an aqueous alkali solution of pH 13.3 obtained by dissolving 28.30 g of potassium silicate and 7.12 g of potassium hydroxide in 464.58 g of water to bring the content as silicone dioxide to a level of 1.5 wt % and further adding 800 ppm of a betaine type amphoteric surfactant ("Amorgen K", manufactured by Daiichi Kogyo Seiyaku K.K.), whereby the longest time wherein the film-remaining ratio of the non-exposed portion can be maintained to be at least 90% while the exposed portion can be completely removed within 2 minutes, was evaluated as the allowance for developing conditions. The results are shown in Table 2.

The film-remaining ratio was determined in such a manner that development was carried out by developer immersion at 28° C. for 60 seconds followed by rubbing 5 times with a sponge, whereby the reflection densities before and after the development at the non-exposed portion were measured by a Macbeth reflection densitometer, and the film-remaining ratio was obtained from the ratio of the reflection densities.

The silicones in Table 2, are as follows.

Emulsion type silicone ①: "SAG-30", manufactured by Nippon Unicar K.K.

Emulsion type silicone ②: "FS Antiform DB-31", manufactured by Dow Corning Asia Co.

Self emulsifiable silicone ①: "FS Antiform 80", manufactured by Dow Corning Asia Co.

Self emulsifiable silicone ②: "FS Antiform DK Q1-071", manufactured by Dow Corning Asia Co.

Self emulsifiable silicone ③: "KS-530", manufactured by Shin-Etsu Chemical Co., Ltd.

Self emulsifiable silicone ④: "KS-537", manufactured by Shin-Etsu Chemical Co., Ltd.

Self emulsifiable silicone ⑤: "KS-538", manufactured by Shin-Etsu Chemical Co., Ltd.

TABLE 2

| | Silicones | | Allowance for developing conditions (seconds) |
|---|---|---|---|
| | Type | Amount (ppm) | |
| Example 6 | — | 0 | 15 |
| Example 7 | Emulsion type silicone ① | 100 | 25 |
| Example 8 | Emulsion type silicone ① | 1000 | 50 |
| Example 9 | Emulsion type silicone ② | 10 | 30 |
| Example 10 | Emulsion type silicone ② | 100 | 40 |
| Example 11 | Self emulsion type silicone ① | 10 | 25 |
| Example 12 | Self emulsion type silicone ① | 100 | 40 |
| Example 13 | Self emulsion type silicone ② | 100 | 40 |
| Example 14 | Self emulsion type silicone ③ | 100 | 40 |
| Example 15 | Self emulsion type silicone ④ | 10 | 25 |
| Example 16 | Self emulsion type silicone ④ | 100 | 70 |
| Example 17 | Self emulsion type silicone ⑤ | 10 | 25 |
| Example 18 | Self emulsion type silicone ⑤ | 100 | 50 |

According to the present invention, it is possible to provide a method for forming a positive image which is excellent in the contrast between an image area and a non-image area and which is excellent also in scratch resistance, while the film-remaining ratio of the image area can be sufficiently maintained.

What is claimed is:

1. A method for forming a positive image, which comprises exposing an image-forming material comprising a substrate and a positive photosensitive composition layer containing a novolak resin and a photo-thermal conversion material which absorbs light from an image exposure light source and converts it to heat and not containing a thermally decomposable material which decomposes by the action of heat generated by the photo-thermal conversion material upon absorption of light from the image exposure light source, formed on the substrate, followed by development with an alkali developer containing an amphoteric surfactant to form a positive image, wherein the positive photosensitive composition layer further contains a solubility-suppressing agent.

2. The method for forming a positive image according to claim 1, wherein the amphoteric surfactant is a betaine type compound.

3. The method for forming a positive image according to claim 1, wherein the concentration of the amphoteric surfactant in the alkali developer is from 0.0001 to 20 wt %.

4. The method for forming a positive image according to claim 1, wherein the alkali developer contains a silicate of an alkali metal.

5. The method for forming a positive image according to claim 4, wherein the silicon content in the alkali developer is from 0.5 to 5 wt %, as silicon dioxide, and the ratio of the molar concentration of the silicon dioxide to the molar concentration of the alkali metal is from 0.1 to 1.5.

6. The method for forming a positive image according to claim 1, wherein the alkali developer contains a silicone.

7. The method for forming a positive image according to claim 6, wherein the silicone is a copolymer of a dimethylpolysiloxane with a polyalkylene oxide.

8. The method for forming a positive image according to claim 6, wherein the content of the silicone in the alkali developer is from 1 to 10,000 ppm.

9. The method for forming a positive image according to claim 1, wherein the photo-thermal conversion material is a cyanine dye having an near infrared absorptivity.

10. The method for forming a positive image according to claim 9, wherein the cyanine dye has a boron anion as a counter ion.

11. The method for forming a positive image according to claim 1, wherein the solubility-suppressing agent is an acid-color forming dye having a lactone skeleton.

12. The method for forming a positive image according to claim 1, wherein said exposing is by means of a laser beam of from 650 to 1,300 nm.

13. The method for forming a positive image according to claim 1, wherein the substrate is an aluminum or aluminum alloy substrate for a lithographic printing plate, having grain treatment and anodizing treatment applied thereto.

14. The method for forming a positive image according to claim 1, wherein the photo-thermal conversion material absorbs a part or whole of a wavelength region of from 650 to 1300 nm.

15. The method for forming a positive image according to claim 1, wherein the photosensitive composition layer contains a nonionic surfactant solubility-suppressing agent.

16. The method for forming a positive image according to claim 1, wherein the solubility-suppressing agent contains a sulfonic acid ester.

17. The method for forming a positive image according to claim 1, wherein the photosensitive composition layer contains an organic acid having a pKa of at least 2 or its anhydride.

18. The method for forming a positive image according to claim 1, wherein the photosensitive composition layer has no sensitivity to ultraviolet light.

19. The method for forming a positive image according to claim 1, wherein the concentration of the amphoteric surfactant is from 0.0001 to 20 wt %; wherein the alkali developer contains a silicate of an alkali metal, and wherein the silicon content in the alkali developer is from 0.5 to 5 wt %, as silicon dioxide, and the ratio of the molar concentration of the silicon dioxide to the molar concentration of the alkali metal is from 0.1 to 1.5; wherein the photosensitive composition layer further contains a solubility-suppressing agent; and wherein the photosensitive composition layer has no sensitivity to ultraviolet light.

20. A method for forming a positive image, which comprises exposing an image-forming material comprising a substrate and a positive photosensitive composition layer containing a novolak resin and a photo-thermal conversion material which absorbs light from an image exposure light source and converts it to heat and not containing an onium compound, a diazonium salt and a quinonediazide compound, and having substantially no sensitivity to ultraviolet light, formed on the substrate, followed by development with an alkali developer containing an amphoteric surfactant to form a positive image.

21. A method for forming a positive image, which comprises exposing an image-forming material comprising a substrate and a positive photosensitive composition layer containing a novolak resin and a photo-thermal conversion material which absorbs light from an image exposure light source and converts it to heat and having a solubility which is not substantially changed even when it is left to stand under white fluorescent light with a light intensity of 400 lux for 10 hours, formed on the substrate, followed by development with an alkali developer containing an amphoteric surfactant to form a positive image.

22. The method for forming a positive image according to claim 21, wherein the photo-thermal conversion material absorbs a part or whole of a wavelength region of from 650 to 1300 nm.

23. The method for forming a positive image according to claim 21, wherein the photosensitive composition layer contains a nonionic surfactant solubility-suppressing agent.

24. The method for forming a positive image according to claim 21, wherein the photosensitive composition layer contains a sulfonic acid ester as a solubility-suppressing agent.

25. The method for forming a positive image according to claim 21, wherein the photosensitive composition layer contains an organic acid having a pKa of at least 2 or its anhydride.

26. The method for forming a positive image according to claim 21, wherein the photosensitive composition layer has no sensitivity to ultraviolet light.

27. The method for forming a positive image according to claim 21, wherein the concentration of the amphoteric surfactant is from 0.0001 to 20 wt %; wherein the alkali developer contains a silicate of an alkali metal, and wherein the silicon content in the alkali developer is from 0.5 to 5 wt %, as silicon dioxide, and the ratio of the molar concentration of the silicon dioxide to the molar concentration of the alkali metal is from 0.1 to 1.5; wherein the photosensitive composition layer further contains a solubility-suppressing agent; and wherein the photosensitive composition layer has no sensitivity to ultraviolet light.

* * * * *

UNITED STATES PATENT AND TRADEMARK OFFICE
CERTIFICATE OF CORRECTION

PATENT NO.    : 6,399,279 B1
DATED         : June 4, 2002
INVENTOR(S)   : Urano et al.

It is certified that error appears in the above-identified patent and that said Letters Patent is hereby corrected as shown below:

<u>Title page,</u>
The CPA information has been omitted. Item [45] and the Notice information should read as follows:

-- [45] **Date of Patent:   *Jun. 4, 2002**

[*] Notice: This patent issued on a continued prosecution
application filed under 37 CFR 1.53(d), and is subject to the
twenty year patent term provisions of 35 U.S.C 154(a)(2).

Subject to any disclaimer, the term of this
patent is extended or adjusted under 35
U.S.C. 154(b) by 0 days. --

Signed and Sealed this

Twenty-sixth Day of November, 2002

Attest:

JAMES E. ROGAN
Attesting Officer     Director of the United States Patent and Trademark Office